(12) United States Patent
Uchida

(10) Patent No.: US 7,326,641 B2
(45) Date of Patent: Feb. 5, 2008

(54) SEMICONDUCTOR DEVICE AND METHOD FOR MANUFACTURING THE SAME

(75) Inventor: Yoko Uchida, Kawasaki (JP)

(73) Assignee: Renesas Technology Corp., Tokyo (JP)

( * ) Notice: Subject to any disclaimer, the term of this patent is extended or adjusted under 35 U.S.C. 154(b) by 321 days.

(21) Appl. No.: 11/002,295

(22) Filed: Dec. 3, 2004

(65) Prior Publication Data

US 2005/0121787 A1 Jun. 9, 2005

(30) Foreign Application Priority Data

Dec. 4, 2003 (JP) .............................. 2003-406055

(51) Int. Cl.
*H01L 21/00* (2006.01)

(52) U.S. Cl. .................. 438/618; 438/622; 438/687

(58) Field of Classification Search ................ 438/618, 438/622, 687
See application file for complete search history.

(56) References Cited

U.S. PATENT DOCUMENTS

| | | | | |
|---|---|---|---|---|
| 6,566,261 B2 * | 5/2003 | Ikegami et al. | ............. | 438/687 |
| 6,613,668 B2 | 9/2003 | Meijer et al. | | |
| 6,828,684 B2 * | 12/2004 | Ikegami et al. | ............. | 257/762 |
| 7,176,120 B2 * | 2/2007 | Kanamura | .................. | 438/622 |
| 2002/0050647 A1 * | 5/2002 | Ikegami et al. | ............. | 257/762 |
| 2003/0134232 A1 * | 7/2003 | Yokoyama et al. | ......... | 430/312 |
| 2003/0155657 A1 | 8/2003 | Tonegawa et al. | | |
| 2005/0121787 A1 * | 6/2005 | Uchida | ........................ | 257/751 |
| 2006/0009025 A1 * | 1/2006 | Kanamura | .................. | 438/618 |

FOREIGN PATENT DOCUMENTS

| | | |
|---|---|---|
| JP | 11-297829 | 10/1999 |
| JP | 2000-012539 | 1/2000 |
| JP | 2000-068376 | 3/2000 |
| JP | 2001-244331 | 9/2001 |
| JP | 2001244331 A * | 9/2001 |
| JP | 2002-118168 | 4/2002 |
| JP | 2002-170879 | 6/2002 |
| JP | 2003-273216 | 9/2003 |
| JP | 2003-528467 | 9/2003 |
| JP | 2003-282698 | 10/2003 |
| JP | 2003-297832 | 10/2003 |
| JP | 2003-309170 | 10/2003 |

* cited by examiner

*Primary Examiner*—Laura M. Schillinger
(74) *Attorney, Agent, or Firm*—Antonelli, Terry, Stout & Kraus, LLP.

(57) ABSTRACT

A semiconductor device which can enhance adhesiveness between a barrier conductive film and an organic insulating film, and prevent film-fall-off, and the manufacturing technique thereof are provided. After a silicon nitride film is formed on the main surface of semiconductor substrate, an organic insulating film is formed on the silicon nitride film. The organic insulating film is formed of a material having a dielectric constant lower than that of a silicon oxide film. Subsequently, wiring grooves are formed in the silicon nitride film and the organic insulating film by means of a photolithography technique and etching technique. An oxide film is formed by irradiating the organic insulating film with ultraviolet rays by use of excimer lamp. The ultraviolet-ray irradiation is performed in an atmosphere containing oxygen. A tantalum film serving as a barrier conductive film is formed on the organic insulating film with the mediation of the oxide film.

10 Claims, 13 Drawing Sheets

| CONDITION | CRITICAL LOAD ($\mu$N) |
|---|---|
| NO IRRADIATION | 658 |
| 5-MINUTE ULTRAVIOLET IRRADIATION | 774 |
| 10-MINUTE ULTRAVIOLET IRRADIATION | 827 |

SEMICONDUCTOR DEVICE AND METHOD FOR MANUFACTURING THE SAME

CROSS-REFERENCE TO RELATED APPLICATION

The present application claims priority from Japanese Patent Application No. JP 2003-406055 filed on Dec. 4, 2003, the content of which is hereby incorporated by reference into this application.

TECHNICAL FIELD OF THE INVENTION

The present invention relates to semiconductor devices and manufacturing techniques thereof, and in particular, relates to semiconductor devices employing an organic insulating film as an interlayer dielectric film and techniques which are effective in application to the manufacturing techniques thereof.

BACKGROUND OF THE INVENTION

Recently, copper having a resistance lower than that of aluminum has become more frequently employed as a wiring material, and a wiring formation technique called Damascene method has been studied as a technique for forming wirings by processing above mentioned copper. This Damascene method is roughly classified into Single-Damascene and Dual-Damascene.

Single-Damascene is a method in which, for example after a wiring groove is formed in an insulating film, a copper film for forming a wiring is deposited on the insulating film and in the wiring groove, and then, the copper film is polished by means of, for example, Chemical Mechanical Polishing (CMP) such that the copper film remains only in the wiring groove, thereby forming a buried wiring in the wiring groove.

Dual-Damascene is a method in which, after a wiring groove and a connection hole, which is for providing connection with a wiring of the lower layer, are formed in an insulating film, a copper film for forming a wiring is deposited on the insulating film, and in the wiring groove and the connection hole, and then, the deposited copper film is polished by means of CMP such that the copper film remains only in the wiring groove and the connection hole, thereby forming a buried wiring in the wiring groove and the connection hole.

In a copper wiring which is formed in the above described manner, the copper atoms constituting the copper wiring diffuses into an interlayer dielectric film, which is problematic. The diffusion of copper atoms to the interlayer dielectric film occurs when the copper atoms are ionized since they are in contact with the interlayer dielectric film, and the ions blends into the interlayer dielectric film. When copper atoms are diffused into the interlayer dielectric film in above described manner, insulation resistance of the interlayer dielectric film is deteriorated, thereby resulting in deterioration of reliability between wirings. Therefore, in order to prevent the copper atoms from diffusing into the interlayer dielectric film, a barrier conductive film which is, for example, tantalum, titanium, or tungsten based, is formed between the copper wiring and the interlayer dielectric film (e.g., see Japanese Patent Application Laid-Open Publication No. 2003-297832 (pages 7 to 9)).

Meanwhile, although silicon oxide based insulating films have been used as interlayer dielectric films, recently, in order to reduce signal delay in a high-density wiring, organic insulating films which can reduce wiring capacitance with a dielectric constant lower than that of silicon oxide films and can bring about PFC (PerFluoro-Compound) reduction effects, have been studied for use as interlayer dielectric films.

SUMMARY OF THE INVENTION

The adhesiveness between the above described barrier conductive film and the organic insulating film is, however, weak comparing with the adhesiveness between a barrier conductive film and a silicon oxide film, therefore there caused a problem that film-fall-off occurs between the barrier conductive film and the organic insulating film during a process such as CMP.

An object of the present invention is to provide a semiconductor device which can enhance adhesiveness between a barrier conductive film and an organic insulating film, and prevent film-fall-off, and a manufacturing technique thereof.

The above described object and other objects, and novel characteristics of the present invention are disclosed in the description of the present specification and the attached drawings.

Summary of a typical part of the invention disclosed in the present application is simply explained below.

A semiconductor device according to the present invention includes (a) an organic insulating film, (b) a wiring which is formed so as to be buried in the organic insulating film, and (c) a barrier conductive film formed between a sidewall of the wiring and the organic insulating film; wherein an oxide film is formed between the barrier conductive film and the organic insulating film.

A manufacturing method of a semiconductor device according to the present invention includes (a) a step of forming an organic insulating film on a semiconductor substrate, (b) a step of forming an opening in the organic insulating film, (c) a step of forming an oxide film on the surface of the organic insulating film which is exposed to the opening, by irradiating inside of the opening with light having energy for cutting carbon-carbon bonds which are constituting the organic insulating film, (d) a step of forming a barrier conductive film on the oxide film, (e) a step of forming a conductive film on the barrier conductive film, and (f) a step of removing the portions of the conductive film and the barrier conductive film which portions are formed in the region other than that of the portions of the conductive film and the barrier conductive film buried in the opening while keeping the buried portions remaining therein.

BRIEF DESCRIPTIONS OF THE DRAWINGS

DESCRIPTION OF THE PREFERRED EMBODIMENTS

Figures 1, 2:
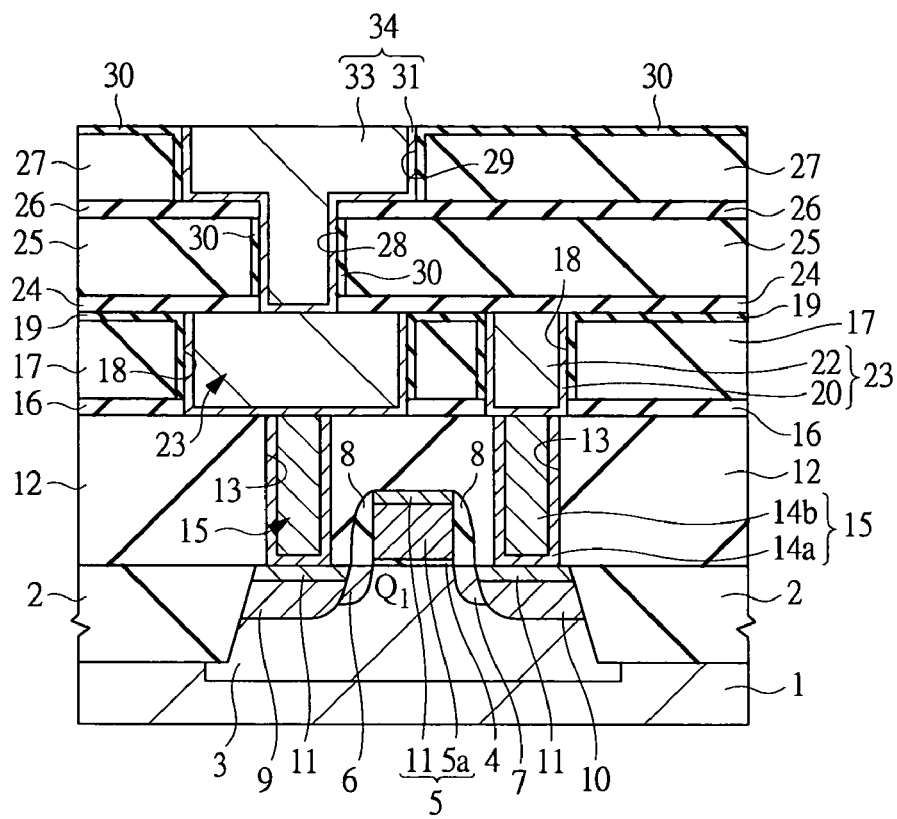
FIG. 1 is a cross sectional view showing a semiconductor device of a first embodiment.
FIG. 2 is a table showing the relation between degree of ultraviolet-ray irradiation and critical load.

Embodiments of the present invention will be described below in detail based on drawings. In all the drawings for explaining the embodiments, same members are basically denoted by the same reference numerals, and redundant explanations thereof are omitted.

First Embodiment

FIG. 1 is a cross sectional view showing a part of a semiconductor device of a first embodiment of the present invention. In FIG. 1, an element isolation region 2 is formed on the main surface (element formation surface) of a semiconductor substrate 1, and a p-type well 3 is formed in an active region which is defined by the element isolation region 2.

An n-channel type MIS (Metal Insulator Semiconductor) transistor $Q_1$ is formed on the p-type well 3. In the MIS transistor $Q_1$, a gate insulator 4 is formed on the p-type well 3, and a gate electrode 5 is formed on the gate insulator 4. The gate electrode 5 is comprised of a polycrystalline silicon film 5a and a cobalt silicide film 11 which is formed on the polycrystalline silicon film 5a in order to obtain a low resistance.

Sidewalls 8 are formed on the both sidewalls of the gate electrode 5, and low-concentration n-type impurity diffusion regions 6 and 7, which are semiconductor regions, are formed below the sidewalls 8 and in the semiconductor substrate 1. High-concentration n-type impurity diffusion regions 9 and 10 doped with an n-type impurity in a concentration higher than that of the low-concentration n-type impurity diffusion regions 6 and 7 are formed outside the low-concentration n-type impurity diffusion regions 6 and 7. A cobalt silicide film 11 for obtaining a low resistance is formed on the upper side of the high-concentration n-type impurity diffusion regions 9 and 10. A titanium silicide film or a nickel silicide film may be formed instead of the cobalt silicide film 11.

An interlayer dielectric film 12 is formed above the MIS transistor $Q_1$, which is formed as described above; and in the interlayer dielectric film 12, contact holes 13 penetrating therethrough toward the high-concentration n-type impurity diffusion regions 9 and 10 of the MIS transistor $Q_1$ are formed. A tantalum film 14a and a tungsten film 14b are buried in each contact hole 13 so as to form a plug 15.

A silicon nitride film 16 and an organic insulating film (first organic insulating film) 17 are formed above the interlayer dielectric film 12 in which the plugs 15 are formed. The organic insulating film 17 is formed of a material having a dielectric constant lower than that of a silicon oxide film, for example, the organic insulating film is formed of a phenylene-based material having aromatic hydrocarbon or a diamond structure. The examples of the phenylene-based material having a diamond structure include phenylated diamond, benzimidazole polymer, and polyallylether.

Wiring grooves (openings) 18 are formed in the silicon nitride film 16 and the organic insulating film 17 above the plugs 15, and an oxide film 19 is formed on the surface of the organic insulating film 17 which is formed at the side surface of each wiring groove 18, and on the upper surface of the organic insulating film 17.

A tantalum film 20 and a copper film 22 are buried in each of the wiring grooves 18, so as to form a wiring (first wiring) 23 which comprises the tantalum film 20 and the copper film 22. The tantalum film 20 is formed in order to prevent the copper atoms constituting the copper film 22 from diffusing into the organic insulating film 17, and is called a barrier conductive film (barrier metal).

Conventionally, the tantalum film 20 is formed on the side surfaces and bottom surfaces of the wiring grooves 18 and directly comes in contact with the organic insulating film 17 on the side surfaces of the wiring grooves 18. However, the adhesiveness between the tantalum film 20, which is a barrier conductive film, and the organic insulating film 17 is weaker than the adhesiveness between the tantalum film 20 and a silicon oxide film, therefore film-fall-off may occur during a process such as CMP. Therefore, in a semiconductor device of the first embodiment, an ultrathin oxide film 19 is formed on the surface of the organic insulating film 17 which is formed on the side surfaces of the wiring grooves, such that the organic insulating film 17 and the tantalum film 20 do not come in direct contact with each other. That is, by forming the oxide film 19 on the surface of the organic insulating film 17, the organic insulating film 17 contacts the tantalum film 20 via the oxide film 19. By forming the oxide film 19 in the organic insulating film 17 in this manner, the adhesive force can be enhanced compare with the case in which the organic insulating film 17 comes in direct contact with the tantalum film 20.

Then, on the wiring 23 and the organic insulating film 17 on which the oxide film 19 is formed, a silicon nitride film 24, an organic insulating film (second organic insulating film) 25, a silicon nitride film 26, and an organic insulating film (third organic insulating film) 27 are sequentially formed; and in these films, a connection hole 28 and a wiring groove 29 are formed. An oxide film 30 is formed on the side surfaces of the connection hole 28 and the wiring groove 29. Meanwhile, a tantalum film 31 and a copper film 33 are formed in the connection hole 28 and the wiring groove 29 so as to be buried therein, and a plug and a wiring 34 which comprises the tantalum film 31 and the copper film 33 are formed.

In the first embodiment, the oxide film 30 is also formed on the side surfaces of the connection hole 28 and the wiring groove 29, therefore the tantalum film 31 comes in direct contact with the oxide films 30 at the side surfaces of the connection hole 28 and the wiring groove 29. Therefore, the adhesive force can be enhanced compare with the case in which the tantalum film 31 comes in direct contact with the organic insulating films 25 and 27.

The adhesive force between a tantalum film and an organic insulating film is conceived to be greatly dependent on the surface condition of the organic insulating film. Therefore, in the first embodiment, an ultrathin oxide film is formed on the surface of the organic insulating film, such that the adhesive force between the tantalum film and the organic insulating film becomes strong.

In a method for forming an ultrathin oxide film on the surface of the organic insulating film, the organic insulating film is irradiated with ultraviolet rays. The organic insulating film is formed from carbon atoms, hydrogen atoms, and oxygen atoms, and when the bonds between them are cut and recombination with other atoms are induced, the surface can be reformed. The ultraviolet rays have energy for cutting the bonds between the carbon atoms, hydrogen atoms, and oxygen atoms which constitute the organic insulating film.

In addition, the ultraviolet rays are absorbed only in the surface layer of the organic insulating film and do not affects the internal part of the film, therefore only the surface of the organic insulating film can be reformed. That is, by introducing a minute amount of oxygen while irradiating the organic insulating film with ultraviolet rays, an oxide film is formed only on the surface of the organic insulating film, thereby enhancing the adhesiveness between the tantalum film, which is a barrier conductive film, and the organic insulating film.

In FIG. 2, there shown the evaluation results of the adhesiveness between the organic insulating film and the tantalum film in cases where irradiation of ultraviolet rays are performed. The evaluation is performed under the conditions in which aromatic hydrocarbon not containing oxygen is employed as the organic insulating film, and after a surface treatment for forming an oxide film is performed by irradiating the surface of the aromatic hydrocarbon with ultraviolet rays, a tantalum film is formed on the aromatic hydrocarbon.

In the evaluation of adhesiveness, nano scratch method is employed. In nano scratch method, a nano-probe is brought into contact with a tantalum film formed on an organic insulating film which is formed of aromatic hydrocarbon, and the nano-probe is moved in the horizontal direction while imposing a vertical load thereon, thereby measuring the adhesiveness. That is, the nano-probe is moved in the horizontal direction while increasing the vertical load in a predetermined ratio. As a result, the vertical load at which the load in the horizontal direction (horizontal load) is distinctively changed is measured. The distinctive point at which the horizontal load distinctively changes indicates the transition point at which the adhesive force between the organic insulating film and the tantalum film becomes weak, and the films start being misaligned. Accordingly, the value of the vertical load corresponds to the strength of the adhesive force between the organic insulating film and the tantalum film, and is called a critical load.

As shown in FIG. 2, when ultraviolet-ray irradiation is not performed, the critical load indicating the strength of the adhesive force between the organic insulating film and the tantalum film is 658 ($\mu$N). Meanwhile, when an oxide film is formed on the surface of the organic insulating film by five-minute irradiation of ultraviolet rays, the adhesive force between the organic insulating film and the tantalum film is enhanced, and the critical load is 774 ($\mu$N). Furthermore, when an oxide film is formed on the surface of the organic insulating film by ten-minute irradiation of ultraviolet rays, the adhesiveness between the organic insulating film and the tantalum film is further enhanced, and the critical load is 827 ($\mu$N). Therefore, the adhesive force of a case in which ten-minute irradiation of ultraviolet rays is performed, is enhanced by about 26% compare with the adhesive force of the case in which irradiation of ultraviolet rays is not performed.

The reason why the adhesive force between the organic insulating film and the tantalum film is enhanced as described above by ultraviolet-ray irradiation, is conceived to be as the following.

In the surface of the organic insulating film which is irradiated with ultraviolet rays, the bonds between carbon atoms which are contained in the organic insulating film are cut by ultraviolet rays, and the carbon atoms having the cut dangling bonds are strongly bonded with oxygen atoms which are in the atmosphere, thereby forming an ultrathin oxide film. When the oxide film is formed, the reaction between the tantalum atoms which are constituent elements of the tantalum film and the carbon atoms which are constituent elements of the organic insulating film is suppressed, and formation of a metallic (metal-like) tantalum film is facilitated. The adhesiveness between the organic insulating film and the tantalum film via the oxide film is enhanced conceivably for this reason. That is, although the adhesive force between the organic insulating film and the tantalum film is weak when the carbon atoms of the organic insulating film are reacted with the tantalum atoms of the tantalum film; when the oxide film is formed on the surface of the organic insulating film, the reaction between the carbon atoms of the organic insulating film and the tantalum atoms of the tantalum film is suppressed, and metallic bonding between the tantalum atoms is facilitated, thereby enhancing the adhesiveness between the organic insulating film and the tantalum film.

Figure 3:
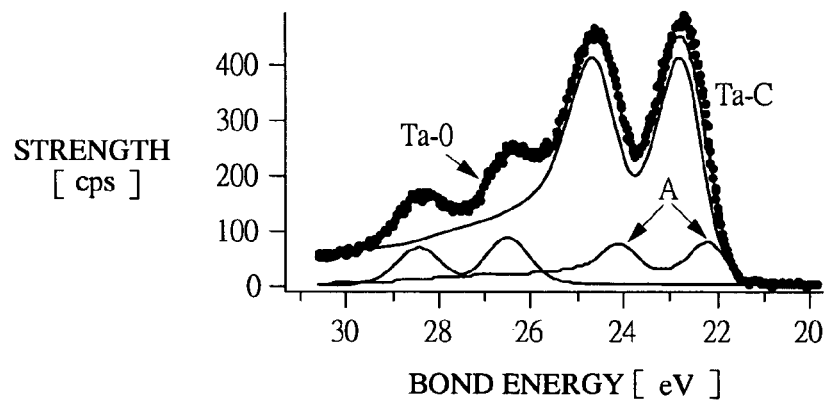
FIG. 3 is a graph showing the results of the measurement of the state of the interface between a tantalum film and an organic insulating film, which is performed by means of XPS in a case where no ultraviolet-ray irradiation is performed.
Figure 4:
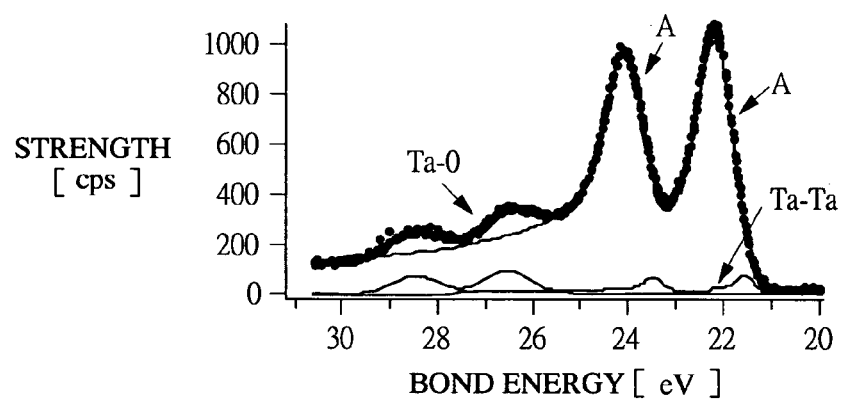
FIG. 4 is a graph showing the results of the measurement of the state of the interface between a tantalum film and an organic insulating film, which is performed by means of XPS in a case where ultraviolet-ray irradiation is performed.
Figure 5:
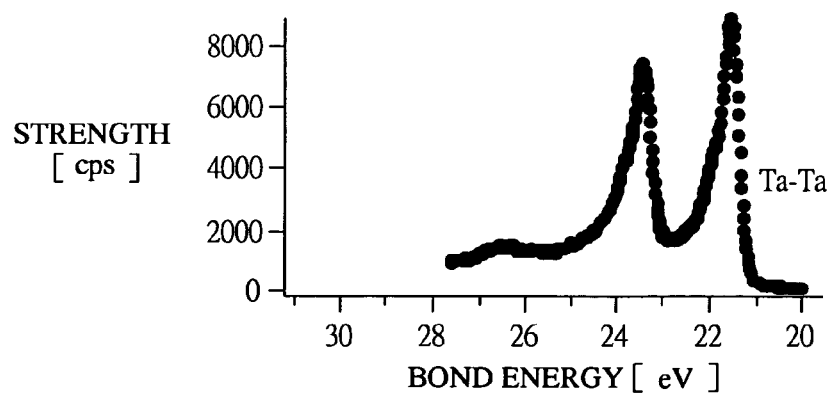
FIG. 5 is a graph showing the results of the measurement of the state of a tantalum film by means of XPS.

The results of an examination which is performed for examining the bond state in the interface between the organic insulating film and the tantalum film by specifically employing XPS (X-ray photoelectron spectroscopy), are shown in FIG. 3, FIG. 4, and FIG. 5. FIG. 3 shows the adhesion state between a tantalum film and an organic insulating film which is formed without irradiation of ultraviolet rays. In FIG. 3, the horizontal axis indicates the bond energy (eV) of tantalum 4$f$ electrons, and the vertical axis indicates the strength (cps). As is clear from FIG. 3, the peaks corresponding to the tantalum-carbon bonds are presented at the positions corresponding to the bond energy of about 23 eV and about 25 eV. Therefore, in a conventional structure provided without ultraviolet-ray irradiation, the tantalum-carbon bonds having weak adhesiveness are predominantly formed between the organic insulating film and the tantalum film.

Next, FIG. 4 shows the adhesion state between a tantalum film and an organic insulating film which is formed with ten-minute irradiation of ultraviolet rays. Also in FIG. 4, the horizontal axis indicates the bond energy (eV) of tantalum 4$f$ electrons, and the vertical axis indicates the strength (cps). As is clear from FIG. 4, peaks A are presented at the positions corresponding to the bond energy of about 24 eV and about 22 eV, which are different from the peaks shown in FIG. 3 corresponding to the tantalum-carbon bonds. The sharpness of the peaks A is sharper than the sharpness of the peaks which are shown in FIG. 3 and corresponding to the tantalum-carbon bonds.

Next, FIG. 5 shows the state of a single tantalum film. Also in FIG. 5, the horizontal axis indicates the bond energy (eV) of tantalum 4$f$ electrons, and the vertical axis indicates the strength (cps). As is clear from FIG. 5, the peaks are presented at the positions corresponding to the bond energy of about 23.5 eV and about 21.5 eV, and the peaks corresponds to tantalum-tantalum bonds. The sharpness of the peaks corresponding to tantalum-tantalum bonds is sharper than that of the peaks of FIG. 3 and FIG. 4.

As is clear from the above discussion, the peaks A shown in FIG. 4 have the shapes in an intermediate state between the peaks shown in FIG. 3 and the peaks shown in FIG. 5. Therefore, in a state in which a tantalum film adheres on an organic insulating film which has been irradiated with ultraviolet rays, tantalum-carbon bonds are suppressed and metallic tantalum-tantalum bonds increases. Therefore, in the state shown in FIG. 4, the adhesiveness between the organic insulating film and the tantalum film is conceivably enhanced compare with the state which is shown in FIG. 3.

As described above, reforming of the organic insulating film is important for enhancing the adhesiveness between the organic insulating film and the tantalum film (metallic film). However, when the organic insulating film per se (entirety of the organic insulating film) is reformed, the dielectric constant increases and there reduced the advantage of employing an organic insulating film, which has a low dielectric constant, as an interlayer dielectric film. Therefore, in reforming like that of the first embodiment which is performed by irradiation of ultraviolet rays, only the surface of the organic insulating film is reformed. Accordingly, the adhesiveness with the tantalum film can be enhanced while maintaining a low dielectric constant. In the surface reforming of the first embodiment which is performed by means of ultraviolet-ray irradiation, an ultrathin oxide film of about 10 nm or less can be formed.

Hereinabove, a tantalum film is explained as an example of a barrier conductive film. However, the barrier conductive film is not limited to this, and the adhesiveness can also be enhanced when, for example, a tantalum nitride film, a titanium nitride film, a tungsten nitride film, or a tungsten carbide film is employed as the barrier conductive film.

Next, a manufacturing method of the semiconductor device of the first embodiment will be explained with reference to drawings.

Figure 6:
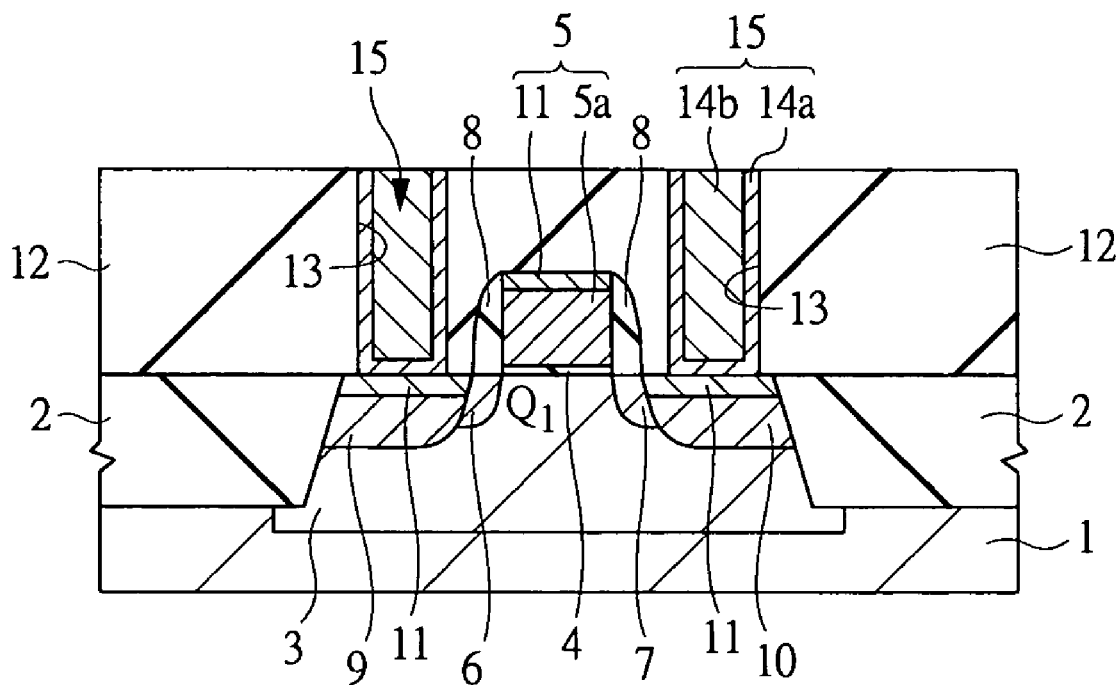
FIG. 6 is a cross sectional view illustrating manufacturing steps of the semiconductor device of the first embodiment.

FIG. 6 is a cross sectional view of the MIS transistor $Q_1$ of the first embodiment in manufacturing steps thereof. First, the manufacturing steps of the MIS transistor $Q_1$ will be explained with reference to FIG. 6.

As shown in FIG. 6, a semiconductor substrate 1 having a specific resistance of, for example, about 1 to 10 Ωcm is prepared. The semiconductor substrate 1 is formed of p-type single crystal silicon, and an element isolation region 2 is formed on the main surface thereof. The element isolation region 2 is formed of silicon oxide and formed by, for example, STI (Shallow Trench Isolation) or LOCOS (Local Oxidization of Silicon).

Next, a p-type well 3 is formed in the active region defined by the element isolation region 2 which is formed on the semiconductor substrate 1, i.e., in the region in which the n-channel type MIS transistor $Q_1$ is to be formed. The p-type well 3 is formed, for example, by introducing boron (B) or boron fluoride ($BF_2$) by ion implantation.

Subsequently, a gate insulator 4 is formed on the p-type well 3. The gate insulator 4 is formed of, for example, thin silicon oxide film, and can be formed, for example, by means of thermal oxidation method.

Then, a gate electrode 5 is formed on the gate insulator 4. The gate electrode 5 is formed in the following manner. First, a polycrystalline silicon film 5$a$ is formed on the gate insulator 4 of the semiconductor substrate 1, and the formed polycrystalline silicon film 5$a$ is implanted with an n-type impurity such as phosphorus (P) by means of, for example, ion implantation. After the polycrystalline silicon film having a low resistance is formed in the above described manner, the polycrystalline silicon film is subjected to patterning by means of a photolithography technique and an etching technique, thereby forming a gate electrode 5 which comprises the polycrystalline silicon film 5$a$.

Next, low-concentration n-type impurity diffusion regions 6 and 7 are formed in the regions at the both sides of the gate electrode 5. The low-concentration n-type impurity diffusion regions 6 and 7 are formed by introducing an n-type impurity such as phosphorous into the p-type well 3 by means of, for example, ion implantation.

Subsequently, sidewalls 8 are formed on the sidewalls of the gate electrode 5. The sidewalls 8 are formed by depositing a silicon oxide film on the semiconductor substrate 1 by means of, for example, CVD (Chemical Vapor Deposition), and subjecting the deposited silicon oxide film to anisotropic etching.

After the sidewalls 8 are formed, high-concentration n-type impurity diffusion regions 9 and 10 are formed in the regions at the both sides of the gate electrode 5. The high-concentration n-type impurity diffusion regions 9 and 10 are formed by introducing an n-type impurity such as phosphorous by means of, for example, ion implantation. The high-concentration n-type impurity diffusion regions 9 and 10 have an impurity concentration higher than that of the above described low-concentration n-type impurity diffusion regions 6 and 7. In the manner described above, a source region which comprises the low-concentration n-type impurity diffusion region 6 and the high-concentration n-type impurity diffusion region 9, and a drain region which comprises the low-concentration n-type impurity diffusion region 7 and the high-concentration n-type impurity diffusion region 10 are formed.

Subsequently, the surfaces of the gate electrode 5 and the high-concentration n-type impurity diffusion regions 9 and 10 are caused to be exposed, and then, a cobalt (Co) film is deposited on the semiconductor substrate 1 by means of, for example, CVD. Then, a cobalt silicide film 11 is formed by performing a heat treatment. As a result, the gate electrode 5 which comprises the polycrystalline silicon film 5a and the cobalt silicide film 11 is formed. The cobalt silicide film 11 can also be formed on the high-concentration n-type impurity diffusion regions 9 and 10. Accordingly, the resistance of the gate electrode 5 is reduced, and the diffusion resistance and the contact resistance of the high-concentration n-type impurity diffusion regions 9 and 10 are reduced. Then, unreacted portion of the cobalt film is removed.

The n-channel type MIS transistor $Q_1$ can be formed on the p-type well 3 in the above described manner.

The wiring steps will be explained subsequently. An interlayer dielectric film 12 is deposited on the semiconductor substrate 1 by means of, for example, CVD. Then, contact holes 13 penetrating the interlayer dielectric film 12 are formed by means of a photolithography technique and an etching technique. In the bottom of the contact holes 13, the cobalt silicide film 11, which is formed on the high-concentration n-type impurity regions 9 and 10, is exposed.

Next, plugs 15 in each of which a tantalum film 14a and a tungsten film 14b are buried are formed in the contact holes 13. The plugs 15 can be formed, for example, in the below described manner. First, after the tantalum film 14a is formed on the interlayer dielectric film 12 including the inside of the contact holes 13 by means of, for example, sputtering, the tungsten film 14b is formed so as to be buried in the contact holes 13 by means of, for example, CVD. Then, unnecessary portions of the tantalum film 14a and the tungsten film 14b which are formed on the interlayer dielectric film 12, are removed by means of CMP or etch back, thereby forming the plugs 15.

FIGS. 7 to 21 are cross sectional views of the manufacturing steps of the semiconductor device following that of FIG. 1. In order to facilitate understanding, in FIG. 7 to FIG. 21, illustration of the structure lower than the silicon oxide film 12 is omitted.

Figure 7:
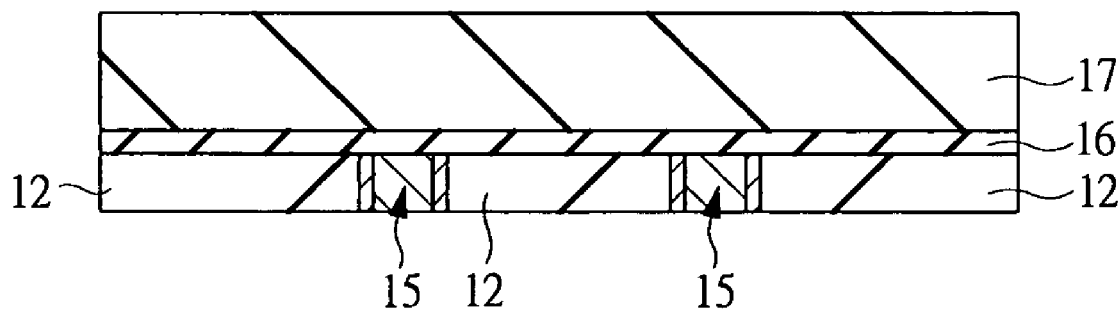
FIG. 7 is a cross sectional view illustrating the manufacturing steps of the semiconductor device subsequent to that of FIG. 6.

First, as shown in FIG. 7, a silicon nitride film 16 is formed on the interlayer dielectric film 12, in which the plugs 15 are formed, for example, by means of CVD. The silicon nitride film 16 serves as a stopper film in etching which is performed later. That is, the silicon nitride film 16 is formed in order to prevent, when grooves for forming a wiring are formed in the organic insulating film 17 by etching, the lower layers from being damaged and processing dimensional accuracy from being deteriorated, which are due to excessive etching. A silicon carbide film may be formed instead of the silicon nitride film 16.

Then, an organic insulating film 17 is formed on the silicon nitride film 16. The organic insulating film 17 can be formed by means of, for example, spin coating. The organic insulating film 17 is formed from hydrocarbon having a dielectric constant lower than that of silicon oxide, for example, the organic insulating film is formed from aromatic hydrocarbon not containing oxygen. The material of the organic insulating film 17 is not limited to aromatic hydrocarbon not containing oxygen, and for example, aromatic hydrocarbon containing oxygen or hydrocarbon not containing aromatic hydrocarbon may be employed.

Figure 8:
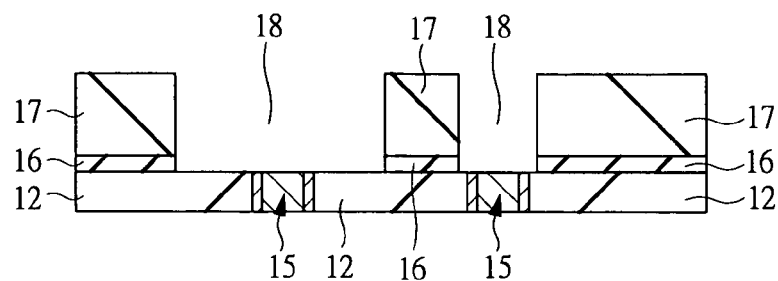
FIG. 8 is a cross sectional view illustrating the manufacturing steps of the semiconductor device subsequent to that of FIG. 7.

Subsequently, as shown in FIG. 8, wiring grooves (openings) 18 are formed in the silicon nitride film 16 and the organic insulating film 17. The wiring grooves 18 can be formed by means of a photolithography technique and an etching technique. The organic insulating film 17 is subjected to dry etching in order to form the wiring grooves 18. The gas employed in the dry etching is, for example, a gas mixture of a hydrogen gas, a nitrogen gas, and an ammonia gas. Therefore, when an organic insulating film is employed as an interlayer dielectric film, a fluorine-containing gas such as a $CF_4$ gas is not used in dry etching, thereby contributing to reduction of PFC, which is a measure for preventing global warming. In the bottom of the wiring grooves 18, the plugs 15, in which the tantalum film 14a and the tungsten film 14b are buried, are exposed.

Figure 9:
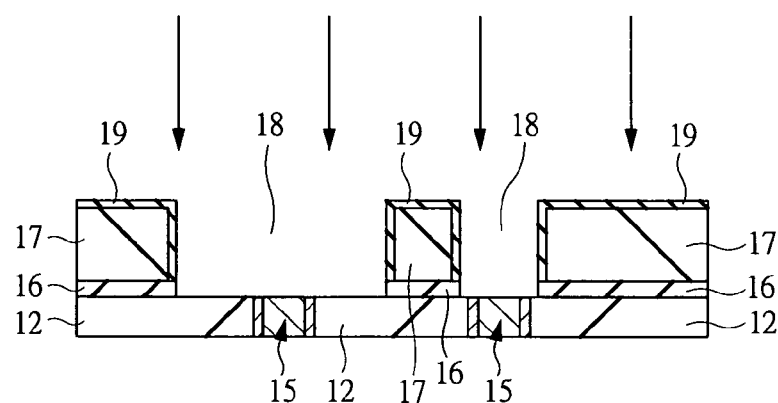
FIG. 9 is a cross sectional view illustrating the manufacturing steps of the semiconductor device subsequent to that of FIG. 8.

Next, as shown in FIG. 9, ultraviolet rays having an emission wavelength of 172 nm are irradiated, by use of an excimer lamp, onto the organic insulating film 17 in which the wiring grooves 18 are formed. As a result of the irradiation of the ultraviolet rays, an oxide film 19 having a thickness of about 10 nm is formed on the surface of the organic insulating film 17 and on the side surfaces of the wiring grooves 18. Specifically, the irradiation of the ultraviolet rays by use of an excimer lamp is performed for ten minutes in an atmosphere having residual oxygen in a dilution amount of 0.01% with respect to an argon or nitrogen gas. The mechanism in which the oxide film 19 is formed, by the ultraviolet-ray irradiation, on the surface of the organic insulating film 17 is described below. That is, the ultraviolet rays radiated from the excimer lamp causes the oxygen atoms in the atmosphere to become radicals, and cut the bonds between carbon atoms which constitute the organic insulating film. Then, the oxygen atoms, which have been caused to be radicals by the ultraviolet rays, are bonded with carbon atoms of which bonds between carbons have been cut and having dangling bonds, therefore an oxide film is formed on the surface of the organic insulating film. The ultraviolet rays are absorbed in the surface of the organic insulating film 17 and do not reach inside thereof. Therefore, the oxide film 19 can be formed only on the surface of the organic insulating film 17.

As described above, the ultraviolet-ray irradiation is performed by use of an excimer lamp in the atmosphere of 0.01% residual oxygen. However, when the ultraviolet rays are radiated, for example, in a vacuum atmosphere of about 1 to 10 Pa, the oxide film 19 can also be formed on the surface of the organic insulating film 17. The formation of the oxide film 19 is not sensitive to oxygen concentration, and depends on the concentration of dangling bonds of carbon atoms which are formed in the organic insulating film 17. Therefore, approximately the same effects can be also obtained, for example, in the atmospheric air.

The wavelength of the radiated light is set to 172 nm, however, the wavelength is not limited to this, and when irradiation is performed with light having a wavelength of 340 nm or less and having the energy for cutting the bonds between carbon atoms which are constituting the organic insulating film 17, the oxide film 19 can be formed on the organic insulating film 17.

Figure 10:
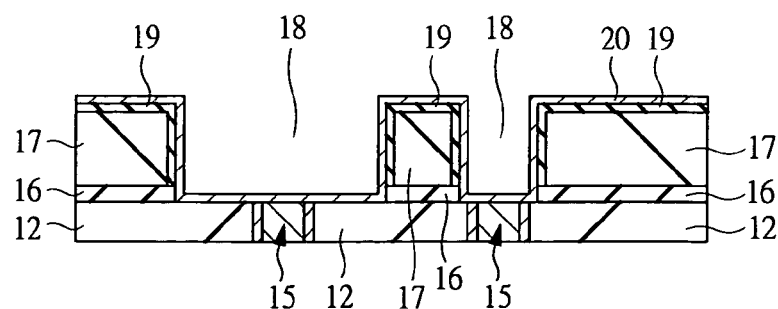
FIG. 10 is a cross sectional view illustrating the manufacturing steps of the semiconductor device subsequent to that of FIG. 9.

Subsequently, as shown in FIG. 10, a tantalum film 20 is formed on the organic insulating film 17 on which the oxide film 19 has been formed. The tantalum film 20 can be formed by means of, for example, sputtering. In this case, the oxide film 19 is formed on the organic insulating film 17 which serves as an undercoat for forming the tantalum film 20 thereon. Therefore, the adhesiveness between the tantalum film 20 and the organic insulating film 17, on which the oxide film 19 has been formed, is enhanced.

The tantalum film 20 has a function as a conductive barrier film. That is, the tantalum film has a function for preventing the copper which is, as is described later, buried in the wiring grooves 18 from diffusing into silicon, etc. As the conductive barrier film, for example, a tantalum nitride film, a titanium nitride film, a tungsten nitride film, or a tungsten carbide film may be employed instead of the tantalum film. Also, a film employing any of these alloys as a predominant material may be employed. In addition, not only the above described single film, but also a laminated film may be employed.

Figure 11:
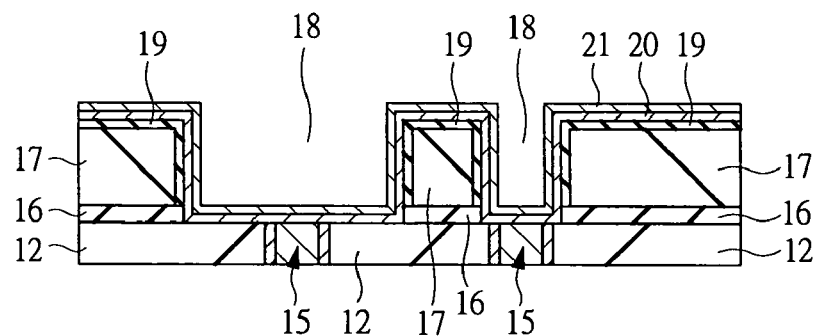
FIG. 11 is a cross sectional view illustrating the manufacturing steps of the semiconductor device subsequent to that of FIG. 10.

Next, as shown in FIG. 11, a comparatively thin seed film 21 which comprises a copper film is formed on the tantalum film 20. The seed film 21 can be formed by means of, for example, sputtering. The seed film 21 is formed in order to enhance the adhesiveness between the tantalum film 20 and a later-described copper film 22 which serves as a main conductive film. The seed film 21 also serves as an electrode when a later-described electrolytic plating is performed.

Figure 12:
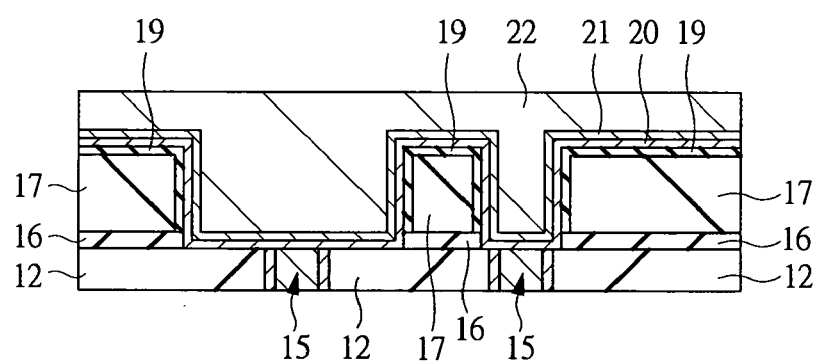
FIG. 12 is a cross sectional view illustrating the manufacturing steps of the semiconductor device subsequent to that of FIG. 11.

Then, as shown in FIG. 12, a copper film 22 which is relatively thick compare with the seed film 21 is formed on the entire surface of the semiconductor substrate 1 so as to be buried in the wiring grooves 18. The copper film 22 can be formed by means of plating such as electrolytic plating or electroless plating. Also, the copper film 22 may be formed by directly forming it on the tantalum film 20, which is a barrier conductive film by means of sputtering, and subsequently subjecting the surface to reflow so as to flatten it; or the copper film 22 may be deposited by means of CVD.

Figure 13:
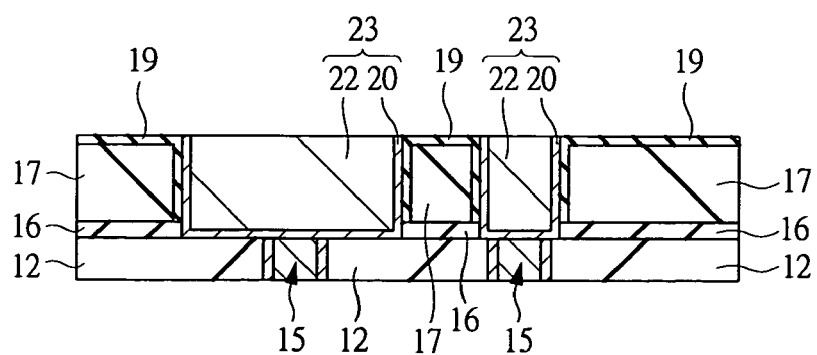
FIG. 13 is a cross sectional view illustrating the manufacturing steps of the semiconductor device subsequent to that of FIG. 12.

Subsequently, as shown in FIG. 13, the portions of the tantalum film 20 and the copper film 22 which are buried in the wiring grooves 18 are kept remaining, while the unnecessary portions of the tantalum film 20 and the copper film 22 which are formed on the organic insulating film 17 are removed, thereby forming a wiring 23. The removal of the unnecessary portions of the tantalum film 20 and the copper film 22 can be performed, for example, by polishing by means of CMP. The wiring 23 is electrically connected, for example, with the source region and the drain region via the plugs 15. The wiring 23 can be formed in the above described manner so as to be buried in the organic insulating film 17. CMP polishing is performed in this step, and, in the wiring grooves 18, the tantalum film 20 does not come in direct contact with the organic insulating film 17, but comes in direct contact with the oxide film 19. Accordingly, by the mediation of the oxide film 19, the adhesiveness between the organic insulating film 17 and the tantalum film 20 can be enhanced. Therefore, fall-off of the tantalum film 20, which is in the wiring grooves 18, can be prevented upon CMP polishing.

Herein, in FIG. 12, the seed film 21 and the copper film 22, which is a main conductive film, are separately illustrated. However, since the seed film 21 and the copper film 22 are formed integrally, they are integrally illustrated in the following drawings.

Figure 14:
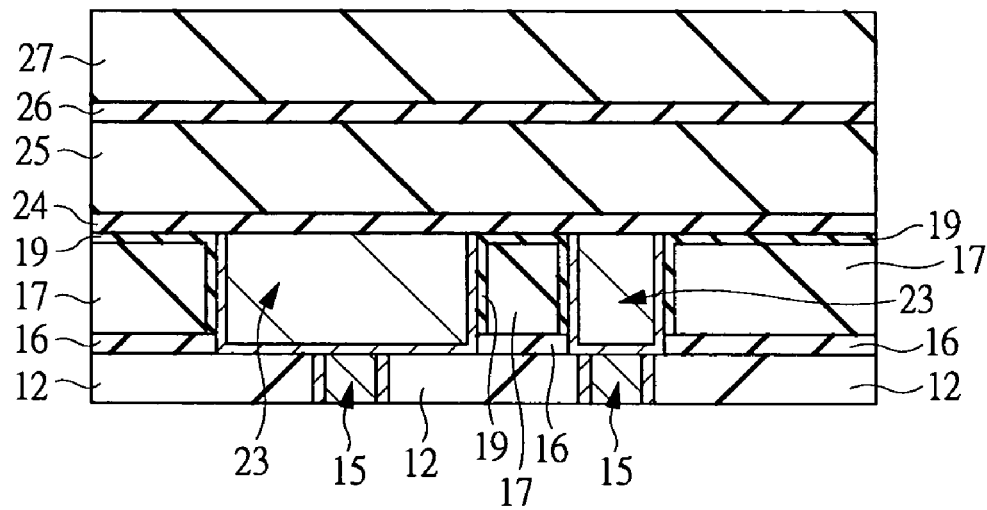
FIG. 14 is a cross sectional view illustrating the manufacturing steps of the semiconductor device subsequent to that of FIG. 13.

Next, as shown in FIG. 14, a silicon nitride film 24 is formed on the organic insulating film 17 on which the oxide film 19 has been formed. The silicon nitride film 24 can be formed by means of, for example, CVD. The silicon nitride film 24 has a function for preventing copper from being diffused from the wiring 23 of the lower layer. Instead of the silicon nitride film 24, a silicon carbide film or a silicon carbonitride film may be formed.

Subsequently, an organic insulating film 25 is formed on the silicon nitride film 24. As well as the organic insulating film 17, the organic insulating film 25 is formed of a material having a dielectric constant lower than that of a silicon oxide film, for example, the organic insulating film is formed of aromatic hydrocarbon not containing oxygen. The organic insulating film 25 can be formed by means of, for example, spin coating. The material of the organic insulating film 25 is not limited to aromatic hydrocarbon not containing oxygen, and for example, aromatic hydrocarbon containing oxygen or hydrocarbon not containing aromatic hydrocarbon may be employed. As is described later, a plug is to be formed in the organic insulating film 25, therefore the organic insulating film 25 has a role for supporting the plug and insulating the plug.

Next, a silicon nitride film 26 is formed on the organic insulating film 25. The silicon nitride film 26 serves as an etching stopper when a wiring groove 29 is formed in an organic insulating film 27, which is described later. Then, an organic insulating film 27 is formed on the silicon nitride film 26. As well as the organic insulating films 17 and 25, the organic insulating film 27 is also formed from a material having a dielectric constant lower than that of a silicon oxide film, and can be formed by means of, for example, spin coating. A wiring 34 is to be formed in the organic insulating film 27 as described later, therefore the organic insulating film 27 has a role for supporting the wiring 34 and insulating the wiring 34 from other wirings.

Figure 15:
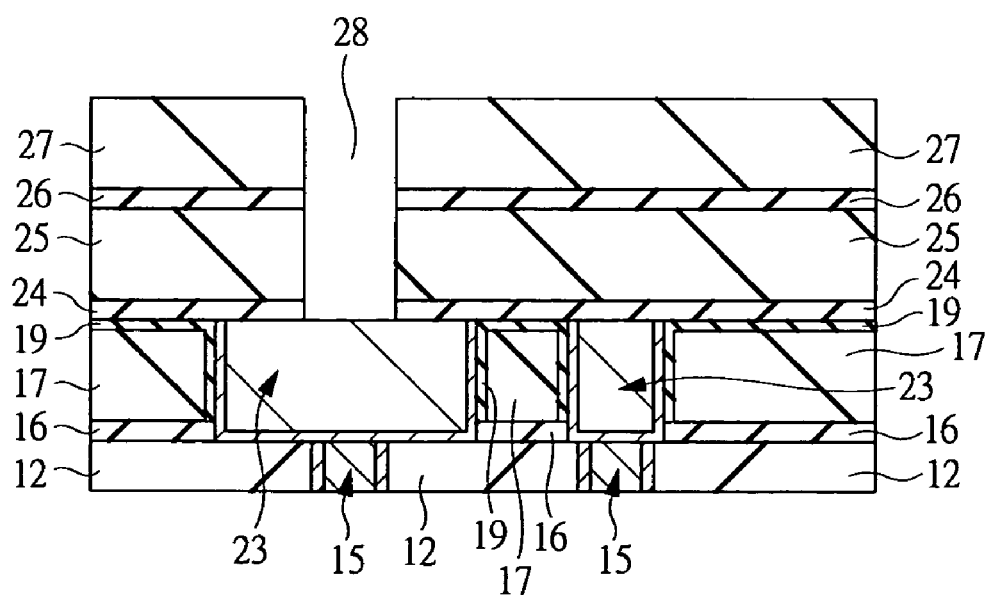
FIG. 15 is a cross sectional view illustrating the manufacturing steps of the semiconductor device subsequent to that of FIG. 14.

Subsequently, as shown in FIG. 15, a connection hole (opening) 28 is formed in the silicon nitride film 24, the organic insulating film 25, the silicon nitride film 26, and the organic insulating film 27, by means of a photolithography technique and an etching technique. Herein, in etching of the organic insulating films 25 and 27, a gas mixture of, for example, a hydrogen gas, a nitrogen gas, and an ammonia gas are used. Therefore, since a gas containing fluorine such as $CF_4$ is note used, the manufacturing method of a semiconductor device of the first embodiment can contribute to reduction of PFC.

Figure 16:
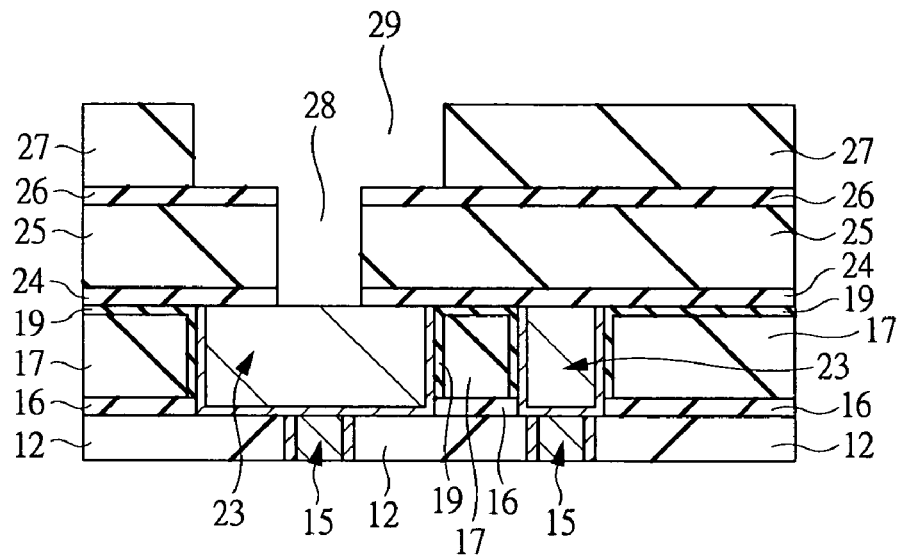
FIG. 16 is a cross sectional view illustrating the manufacturing steps of the semiconductor device subsequent to that of FIG. 15.

Next, as shown in FIG. 16, a wiring groove (opening) 29 which is larger than the connection hole 28 is formed in the organic insulating film 27 by means of a photolithography technique and an etching technique. In formation of the wiring groove 29, the silicon nitride film 26 serves as an etching stopper.

Figure 17:
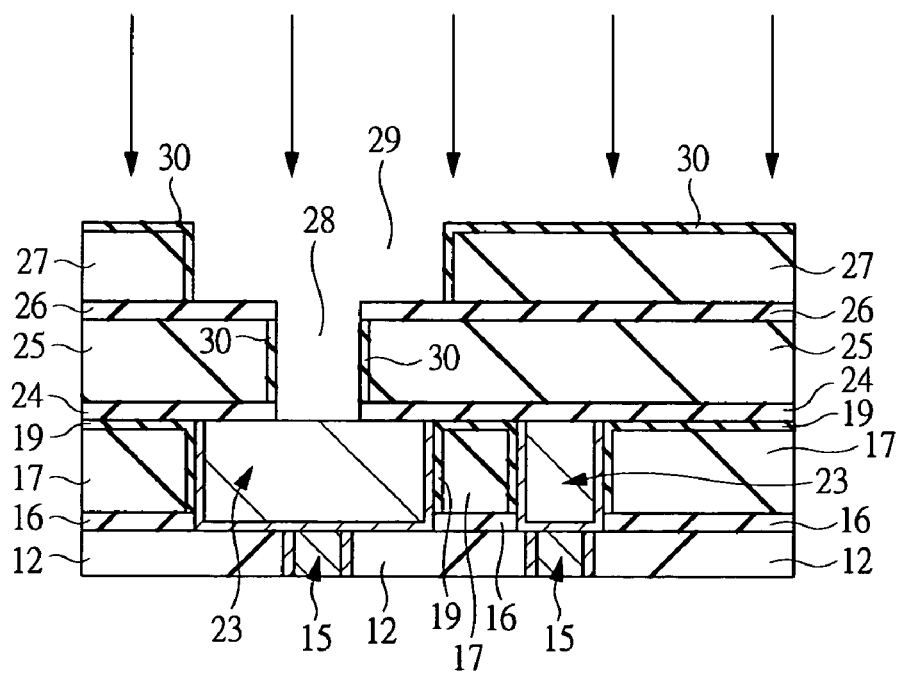
FIG. 17 is a cross sectional view illustrating the manufacturing steps of the semiconductor device subsequent to that of FIG. 16.

Next, as shown in FIG. 17, in the atmosphere containing oxygen, ultraviolet rays having an emission wavelength of 172 nm are irradiated, by use of an excimer lamp, onto the organic insulating film 27 on which the wiring groove 29 has been formed. As a result of the irradiation of the ultraviolet rays, an oxide film 30 having a thickness of about 10 nm can be formed on the surface of the organic insulating film 27 and on the side surfaces of the wiring groove 29. By irradiating the ultraviolet rays, the oxide film 30 having a thickness of about 10 nm is also formed on the portion of the organic insulating film 25 which is exposed to the side surfaces of the connection hole 28.

Figure 18:
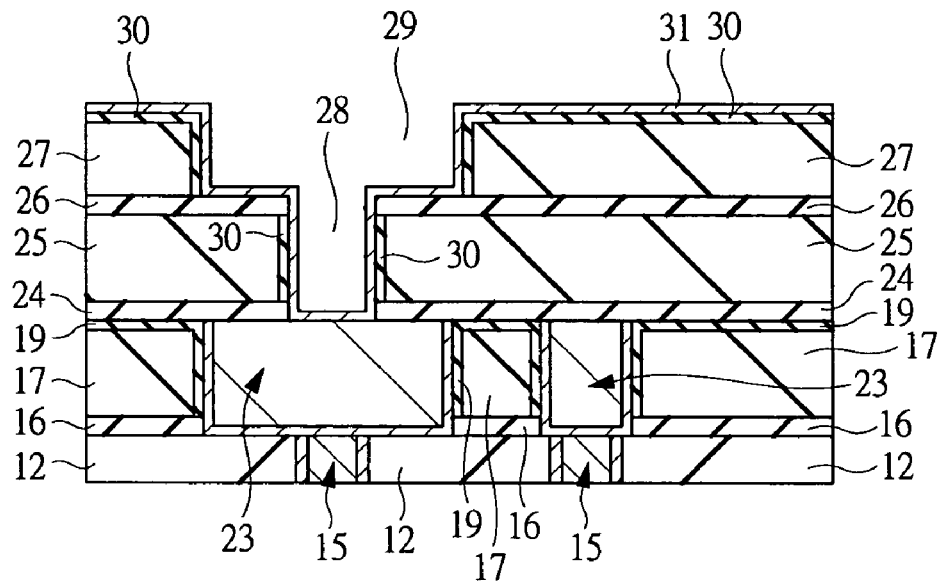
FIG. 18 is a cross sectional view illustrating the manufacturing steps of the semiconductor device subsequent to that of FIG. 17.

Subsequently, as shown in FIG. 18, a tantalum film 31 is formed on the surfaces of the connection hole 28, wiring groove 29, and the organic insulating film 27. The tantalum film 31 can be formed by means of, for example, sputtering. Herein, as shown in FIG. 18, the oxide film 30 has been formed on the side surfaces of the connection hole 28 and the wiring groove 29, and on the surface of the organic insulating film 27. Therefore, on the side surfaces of the connection hole 28 and the wiring groove 29, and on the surface of the organic insulating film 27, the tantalum film 31 does not come in direct contact with the organic insulating film 25 and the organic insulating film 27, but comes in direct contact with the oxide film 30. Accordingly, the adhesiveness between the organic insulating films 25 and 27 and the tantalum film 31 can be enhanced. The tantalum film 31 has a function same as that of the above described tantalum film 20, and for example, has a function for preventing copper diffusion.

Figure 19:
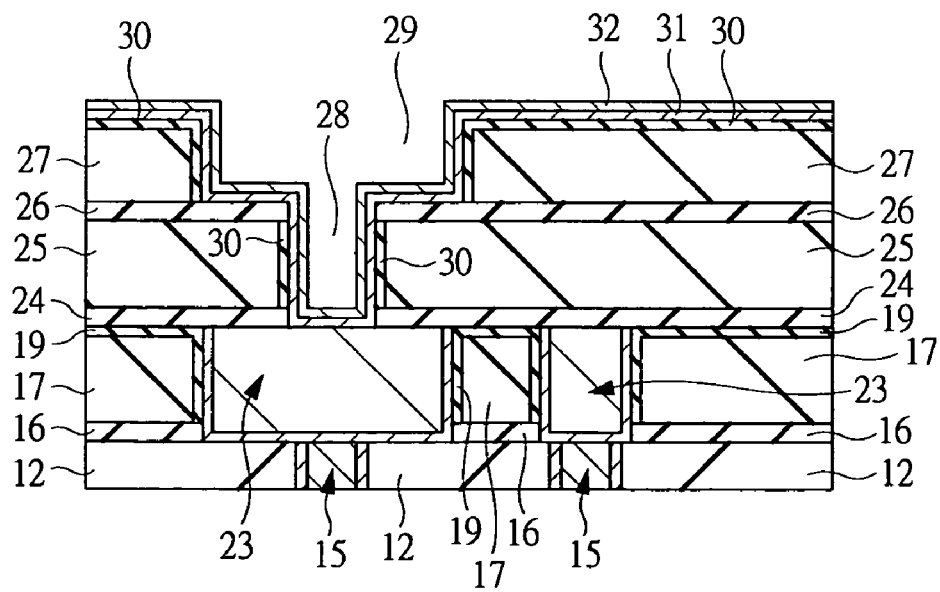
FIG. 19 is a cross sectional view illustrating the manufacturing steps of the semiconductor device subsequent to that of FIG. 18.
Figure 20:
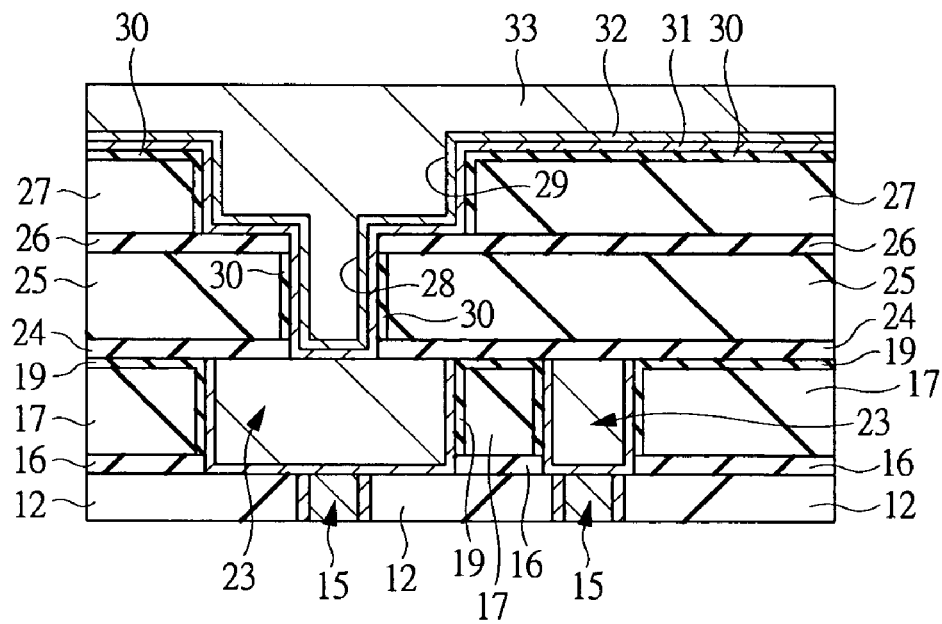
FIG. 20 is a cross sectional view illustrating the manufacturing steps of the semiconductor device subsequent to that of FIG. 19.

Next, as shown in FIG. 19, a comparatively thin seed film 32 which comprises a copper film is formed, for example by means of sputtering, on the semiconductor substrate 1 on which the tantalum film 31 has been formed. Then, as shown in FIG. 20, a copper film 33 is formed so as to be buried in the connection hole 28 and the wiring groove 29. The copper film 33 can be formed by means of, for example, plating.

Figure 21:
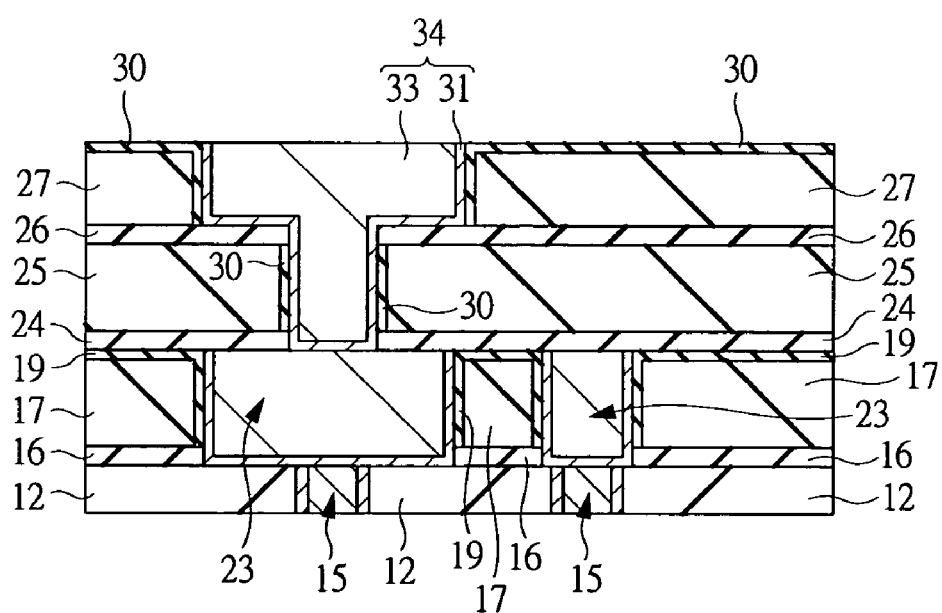
FIG. 21 is a cross sectional view illustrating the manufacturing steps of the semiconductor device subsequent to that of FIG. 20.

Subsequently, as shown in FIG. 21, the portions of the tantalum film 31 and the copper film 33 which are buried in the connection hole 28 and the wiring groove 29 are kept remaining, while the unnecessary portions of the tantalum film 31 and the copper film 33 which are formed on the organic insulating film 27 are removed, thereby forming a wiring 34. The removal of the unnecessary portion of the tantalum film 31 and the unnecessary portion of the copper film 33 can be performed, for example, by polishing by means of CMP. In FIG. 21, since the seed film 32 and the copper film 33, which is a main conductive film, are integrally formed, they are illustrated as the copper film 33.

The semiconductor device of the first embodiment can be formed in the manner described above. In addition, by repeating the same manufacturing steps, wirings following the second layer wiring can be formed, however, it is omitted herein.

In the first embodiment, only the surface of the organic insulating film (including the side surfaces of the connection hole and the wiring groove) is reformed by irradiating the surface of the organic insulating film with ultraviolet rays in the atmosphere containing oxygen. Therefore, the adhesiveness between the organic insulating film and the barrier conductive film such as the tantalum film can be enhanced while maintaining a low dielectric constant. That is, since the oxide film is formed on the surface of the organic insulating film, and the barrier conductive film such as the tantalum film adheres the organic insulating film via the formed oxide film; the adhesiveness between the barrier conductive film and the organic insulating film can be enhanced while maintaining the low dielectric constant of the organic insulating film. Therefore, fall-off of the barrier conductive film which occurs in a step such as polishing by means of CMP can be prevented.

As discussed above, the adhesiveness between the organic insulating film and the barrier conductive film is enhanced in the first embodiment, therefore a highly reliable copper wiring structure which employs a low-dielectric-constant organic insulating film as an interlayer dielectric film can be realized.

The delay time of signals in a semiconductor device is proportional to the product of wiring capacitance (capacitance of interlayer dielectric film) and wiring resistance. Therefore, in the first embodiment, an organic insulating film having a low dielectric constant is employed as an interlayer dielectric film so as to reduce the wiring capacitance, and copper is employed as the wiring material so as to reduce the wiring resistance. Accordingly, in the first embodiment, since the wiring capacitance and the wiring resistance are reduced, the delay time of signals can be reduced. At the same time, the electric power consumption can be also reduced, since the electric power consumed in wiring is proportional to wiring capacitance.

In addition, in the dry etching step for processing the organic insulating film, a gas such as $CF_4$ is not required to be used, thereby contributing to reduction of PFC, which is a measure for preventing global warming.

In the first embodiment, there explained a case in which a tantalum film is employed as a barrier conductive film, however, the effects same as the above described effects can also be obtained even when, for example, a tantalum nitride film, a titanium nitride film, a tungsten nitride film, or a tungsten carbide film is employed.

In the first embodiment, aromatic hydrocarbon not containing oxygen is employed as an example material of the organic insulating film, however, the effects same as the above described effects can be obtained even when, for example, aromatic hydrocarbon containing oxygen or hydrocarbon not containing aromatic hydrocarbon is employed.

Second Embodiment

A manufacturing method of a semiconductor device of a second embodiment of the present invention will be explained with reference to drawings.

Figure 22:
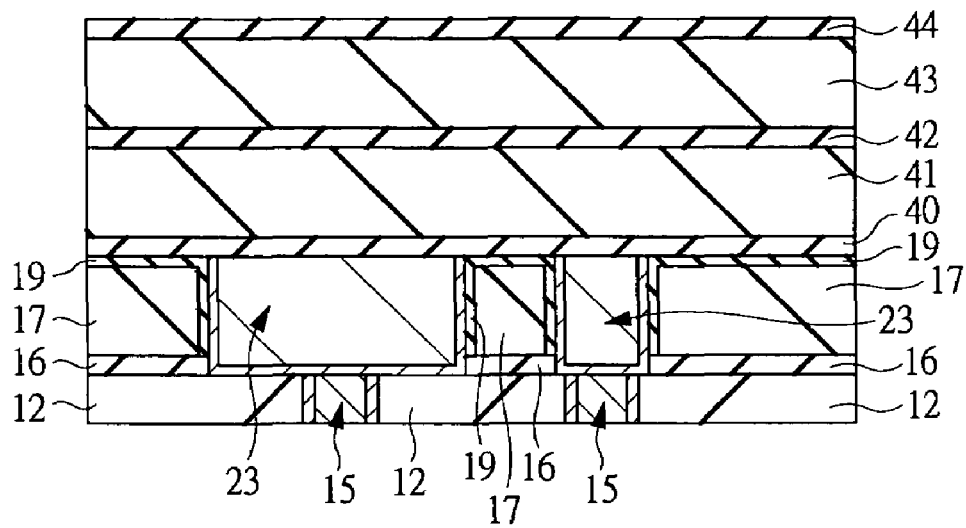
FIG. 22 is a cross sectional view illustrating manufacturing steps of a semiconductor device of a second embodiment.

The steps of FIG. 6 to FIG. 13 are same as those of the first embodiment, therefore explanations thereof are omitted. Subsequently, as shown in FIG. 22, a silicon nitride film 40, an organic insulating film 41, a silicon nitride film 42, an organic insulating film 43, and a silicon nitride film 44 are formed sequentially on the organic insulating film 17 on which the oxide film 19 has been formed.

The silicon nitride film 40 can be formed by means of, for example, CVD, and is provided in order to prevent copper atoms from being diffused from the wiring 23 which is in the lower layer. The organic insulating film 41 is formed of a material having a dielectric constant lower than that of a silicon oxide film, for example, the organic insulating film is formed from aromatic hydrocarbon not containing oxygen. As is described later, a plug is to be formed in the organic insulating film 41, therefore the organic insulating film 41 has a role for supporting the plug and insulating the plug. The material of the organic insulating film 41 is not limited to aromatic hydrocarbon not containing oxygen, and for example, aromatic hydrocarbon containing oxygen or hydrocarbon not containing aromatic hydrocarbon may be employed.

Next, the silicon nitride film 42 is formed by means of, for example, CVD, and serves as an etching stopper when a wiring groove 46 is formed in the organic insulating film 43, which are described later. As well as the organic insulating film 41, the organic insulating film 43 is formed of a material having a dielectric constant lower than that of a silicon oxide film, and is formed by means of, for example, spin coating. As is described later, a wiring 50 is to be formed in the organic insulating film 43, therefore the organic insulating film 43 has a role for supporting the wiring 50 and insulating the wiring 50 from other wirings.

The silicon nitride film 44 is provided in order to prevent the copper atoms of a copper film, which is deposited in a later-described step, from being diffused into the organic insulating film 43.

Figure 23:
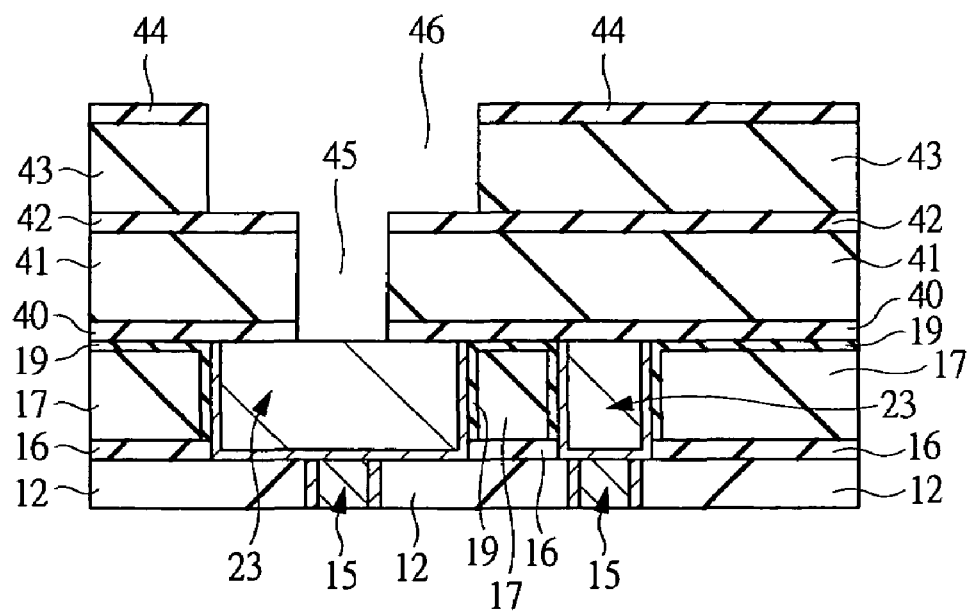
FIG. 23 is a cross sectional view illustrating the manufacturing steps of the semiconductor device subsequent to that of FIG. 22.

Next, as shown in FIG. 23, a connection hole 45 and a wiring groove 46 are formed by means of a photolithography technique and an etching technique. The formation is more specifically explained as the following. First, the silicon nitride film 44, the organic insulating film 43, the silicon nitride film 42, the organic insulating film 41, and the silicon nitride film 40 are subjected to etching sequentially, thereby forming the connection hole 45. Then, the silicon nitride film 44 and the organic insulating film 43 are subjected to etching, thereby forming the wiring groove 46. Herein, the silicon nitride film 42 serves as a stopper when the organic insulating film 43 is subjected to etching.

Figure 24:
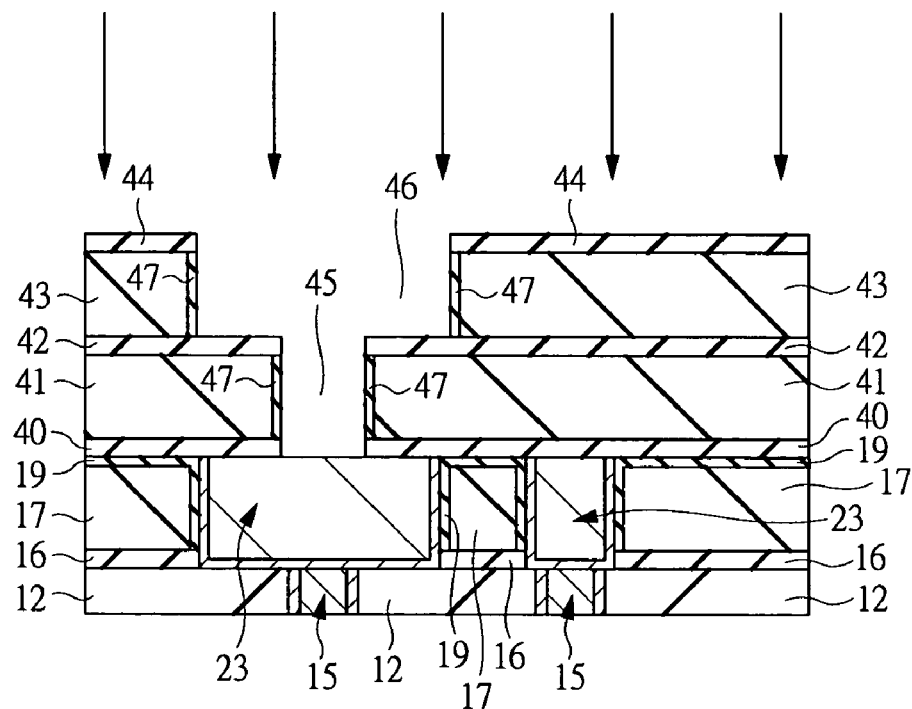
FIG. 24 is a cross sectional view illustrating the manufacturing steps of the semiconductor device subsequent to that of FIG. 23.

Next, as shown in FIG. 24, ultraviolet rays having a wavelength of about 172 nm are irradiated onto the element formation surface of the semiconductor substrate 1 (unillustrated) by use of an excimer lamp. The ultraviolet rays are also irradiated to the inside of the connection hole 45 and the wiring groove 46. The irradiation of the ultraviolet rays is performed for ten minutes in an atmosphere having residual oxygen in a dilution amount of 0.01% with respect to an argon or nitrogen gas. As a result, an oxide film 47 having a thickness of, for example, about 10 nm is formed on the side surfaces of the connection hole 45 and on the side surfaces of the wiring groove 46. In the above described first embodiment, the oxide film 30 is also formed on the surface of the organic insulating film 27, in addition to the side surfaces of the connection hole 28 and the side surfaces of the wiring groove 29. However, in the second embodiment, the oxide film 47 is formed only on the side surfaces of the connection hole 45 and on the side surfaces of the wiring groove 46, since the silicon nitride film 44 is formed on the organic insulating film 43. Herein, the irradiation of the ultraviolet rays is performed for ten minutes in an atmosphere having residual oxygen in a dilution amount of 0.01% with respect to an argon or nitrogen gas, however, it is not limited to this, and the same oxide film 47 can be formed even when the irradiation is performed in a vacuum atmosphere of about 1 to 10 Pa. Moreover, when the irradiation is performed in the atmospheric air, the result is approximately the same.

Figure 25:
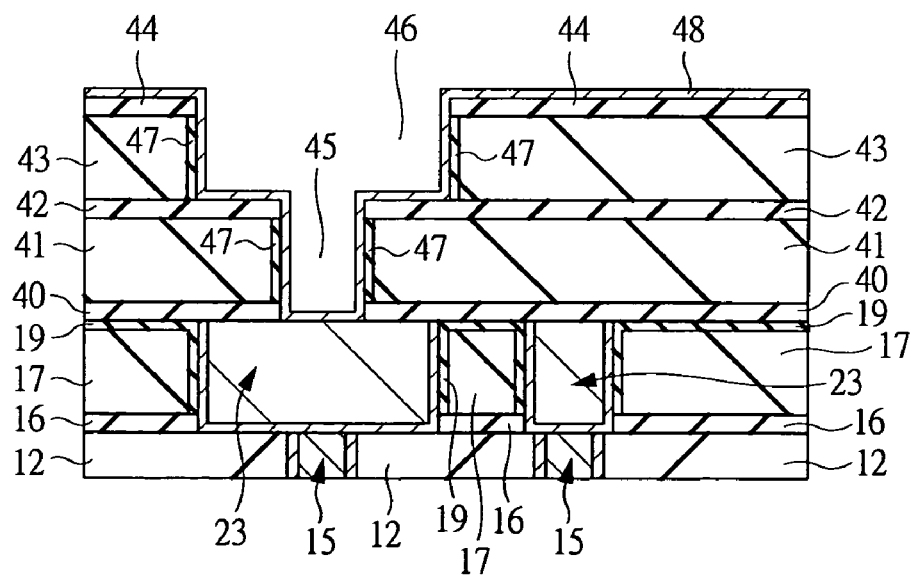
FIG. 25 is a cross sectional view illustrating the manufacturing steps of the semiconductor device subsequent to that of FIG. 24.

Next, as shown in FIG. 25, a tantalum film 48 is formed on the main surface (element formation surface) of the semiconductor substrate 1. The tantalum film 48 can be formed by means of, for example, sputtering. The positions where the tantalum film 48 is to be brought into direct contact with the organic insulating films 41 and 43, are the side surfaces of the connection hole 45 and the side surfaces of the wiring groove 46. However, the oxide film 47 is formed on the side surfaces of the connection hole 45 and the side surfaces of the wiring groove 46 by the irradiation of ultraviolet rays. Accordingly, in the second embodiment, the adhesiveness between the organic insulating films 41 and 43 and the tantalum film 48 can be enhanced. That is, when the tantalum film 48 is brought into direct contact with the organic insulating films 41 and 43, adhesiveness becomes weak. However, when the oxide film 47 is formed and the tantalum film is brought into contact with the organic insulating films 41 and 43 via the oxide film, the adhesiveness is enhanced.

Figure 26:
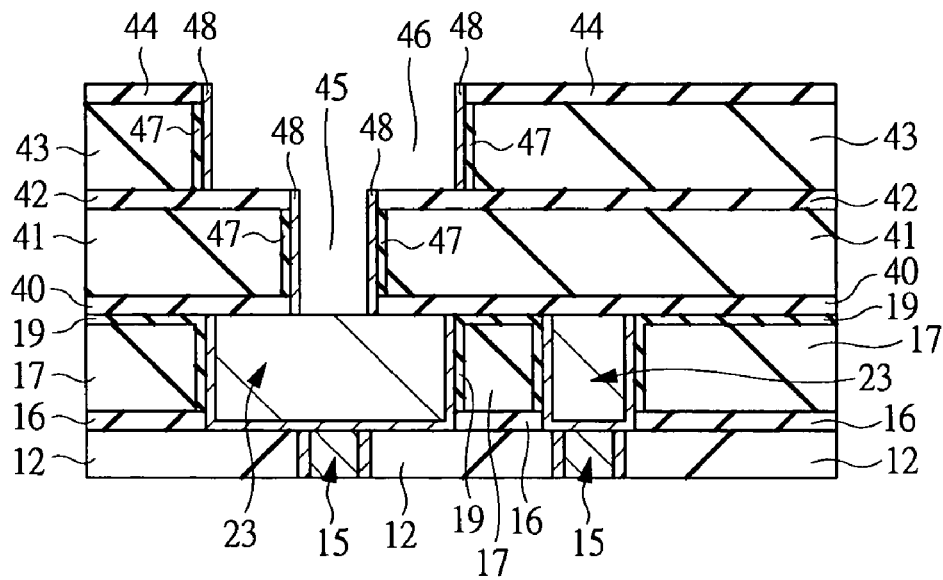
FIG. 26 is a cross sectional view illustrating the manufacturing steps of the semiconductor device subsequent to that of FIG. 25.

Subsequently, as shown in FIG. 26, the portions of the tantalum film 48 which are formed on the bottom surface of the connection hole 45, the bottom surface of the wiring groove 46, and on the silicon nitride film 44, are removed by means of sputter etching. This is performed for removing the portion of the tantalum film 48 which is formed on the bottom surface of the connection hole 45, thereby exposing the wiring 23 which comprises the copper film 22. In the first embodiment, a seed film which comprises a copper film is formed on the tantalum film 48, and a copper film is deposited by employing the formed seed film as an electrode. Meanwhile, in the second embodiment, no seed film is formed, and the wiring 23 which is exposed at the bottom surface of the connection hole 45 is employed as an electrode, therefore the portion of the tantalum film 48 which is formed on the bottom surface of the connection hole 45 is removed by means of sputter etching.

Figure 27:
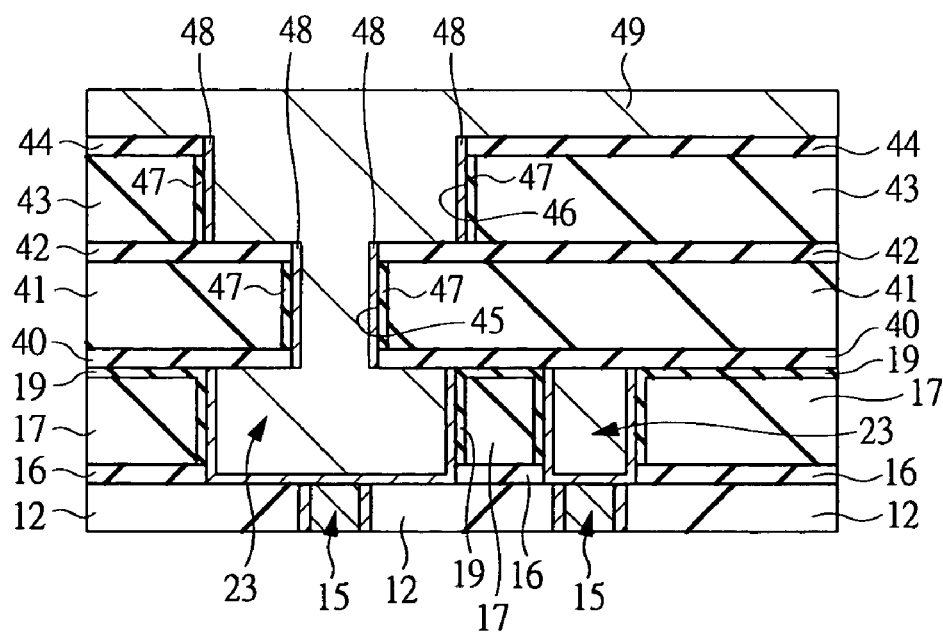
FIG. 27 is a cross sectional view illustrating the manufacturing steps of the semiconductor device subsequent to that of FIG. 26.

Next, as shown in FIG. 27, a copper film 49 is formed so as to be buried in the connection hole 45 and the wiring groove 46. The copper film 49 is formed by means of plating by employing the wiring 23 as an electrode. Herein, the copper film 49 is deposited also on the silicon nitride film 44. Therefore, the silicon nitride film 44 prevents the copper film 49 from being brought into direct contact with the organic insulating film 43, thereby preventing copper atoms from diffusing into the organic insulating film 43 which is caused by the direct contact between the copper film 49 and the organic insulating film 43.

Figure 28:
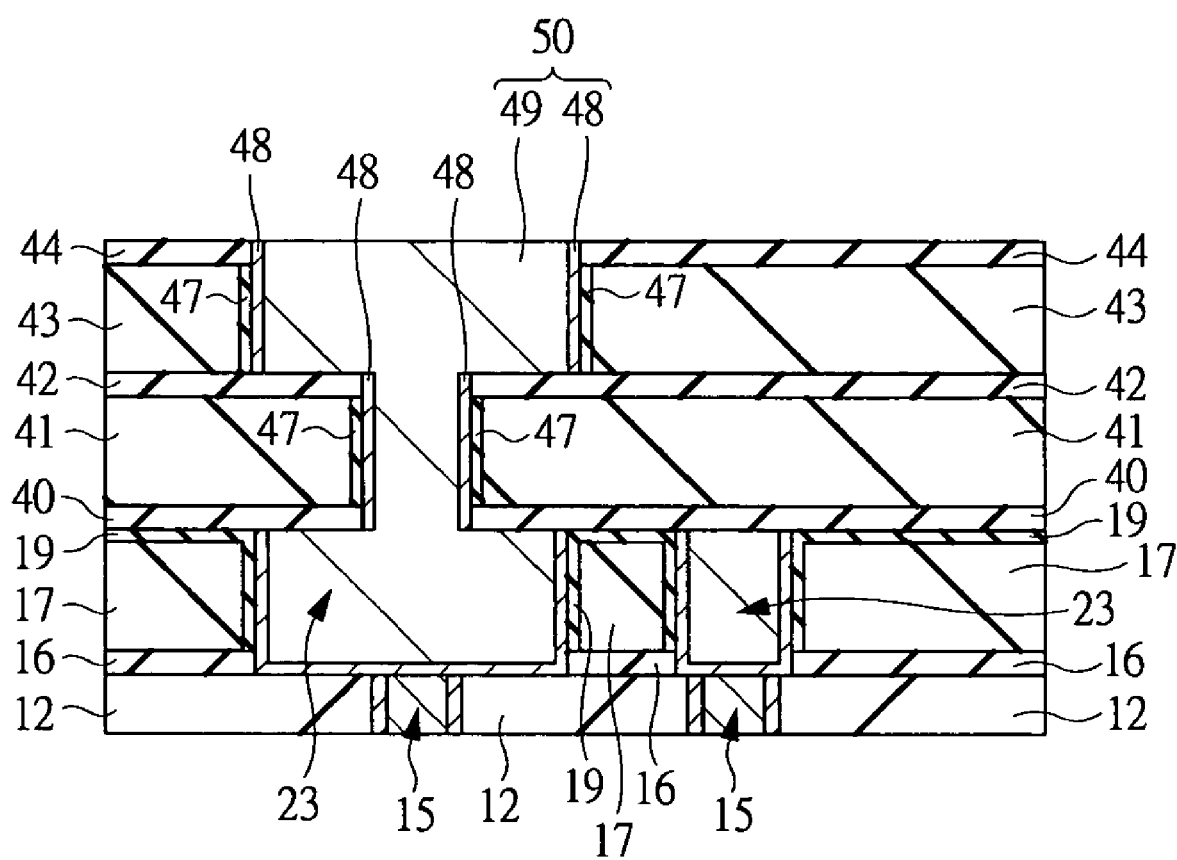
FIG. 28 is a cross sectional view illustrating the manufacturing steps of the semiconductor device subsequent to that of FIG. 27.

Subsequently, as shown in FIG. 28, the portion of the copper film 49 which is buried in the connection hole 45 and the wiring groove 46 is kept remaining, while the unnecessary portion of the copper film 49 which is formed on the silicon nitride film 44 is removed, thereby forming a wiring 50. The removal of the unnecessary portion of the copper film 49 can be performed, for example, by polishing by means of CMP. The semiconductor device of the second embodiment can be manufactured in the manner described above. In addition, by repeating the same manufacturing steps, wirings following the second layer wiring can be formed, however, it is omitted herein.

In the second embodiment, the oxide film is formed only on the side surfaces of the connection hole and the wiring groove by irradiating the surface of the organic insulating film with ultraviolet rays in the atmosphere containing oxygen. Therefore, the adhesiveness between the organic insulating film and the barrier conductive film such as the tantalum film can be enhanced while maintaining a low dielectric constant. Therefore, fall-off of the barrier conductive film which occurs in a step such as polishing by means of CMP can be prevented.

As discussed above, the adhesiveness between the organic insulating film and the barrier conductive film is enhanced in the second embodiment, therefore a highly reliable copper wiring structure which employs a low-dielectric-constant organic insulating film as an interlayer dielectric film can be realized.

In the second embodiment, an organic insulating film having a low dielectric constant is employed as an interlayer dielectric film so as to reduce the wiring capacitance, and copper is employed as the wiring material so as to reduce the wiring resistance. Accordingly, in the second embodiment, since the wiring capacitance and the wiring resistance are reduced, the delay time of signals can be reduced. At the same time, the electric power consumption can be also reduced, since the electric power consumed in wiring is proportional to wiring capacitance.

In addition, in the dry etching step for processing the organic insulating film, a gas such as $CF_4$ is not required to be used, thereby contributing to reduction of PFC, which is a measure for preventing global warming.

In the second embodiment, there explained a case in which a tantalum film is employed as a barrier conductive film, however, the effects same as the above described effects can also be obtained even when, for example, a tantalum nitride film, a titanium nitride film, a tungsten nitride film, or a tungsten carbide film is employed.

In the second embodiment, aromatic hydrocarbon not containing oxygen is employed as an example material of the organic insulating film, however, the effects same as the above described effects can be obtained even when, for example, aromatic hydrocarbon containing oxygen or hydrocarbon not containing aromatic hydrocarbon is employed.

In the foregoing, the invention made by the inventors of this invention has been described in detail based on the embodiments. However, it goes without saying that the present invention is not limited to the above-described embodiments, and various changes and modifications of the invention can be made within the spirit and scope of the invention.

The present invention can be widely utilized in the manufacturing industry for manufacturing semiconductor devices.

Effects obtained by a typical part of the invention disclosed in the present application are simply explained below.

By forming an oxide film on the surface of an organic insulating film, the adhesiveness between the organic insulating film, which serves as an interlayer dielectric film, and a barrier conductive film can be enhanced, and film-fall-off can be prevented.

What is claimed is:

1. A semiconductor device, comprising:
   (a) an organic insulating film,
   (b) a wiring which is formed so as to be buried in the organic insulating film and which includes a copper film, and
   (c) a barrier conductive film formed between a sidewall of the wiring and the organic insulating film;
   wherein an oxide film is formed between the barrier conductive film and the organic insulating film, and
   wherein the oxide film is formed by irradiating the surface of the organic insulating film with light having energy for cutting carbon-carbon bonds.

2. The semiconductor device described in claim 1, wherein the oxide film is formed by oxidizing the surface of the organic insulating film.

3. The semiconductor device described in claim 1, wherein the organic insulating film is comprised of a phenylene-based material.

4. The semiconductor device described in claim 3, wherein the phenylene-based material is comprised of a phenylene-diamond, a benzimidazone polymer or a polyallylether.

5. The semiconductor device described in claim 1, wherein barrier conductive film includes a tantalum film.

6. A semiconductor device, comprising:
   (a) an organic insulating film;
   (b) a wiring which is formed so as to be buried in the organic insulating film and which includes a copper film, and
   (c) a barrier conductive film formed between a sidewall of the wiring and the organic insulating film;
   wherein an oxide film is formed between the barrier conductive film and the organic insulating film, and
   wherein the oxide film is formed by irradiating the surface of the organic insulating film with light having an emission wavelength of 170 nm.

7. The semiconductor device described in claim 6, wherein the oxide film is formed by oxidizing the surface of the organic insulating film.

8. The semiconductor device described in claim 6, wherein the organic insulating film is comprised of a phenylene-based material.

9. The semiconductor device described in claim 8, wherein the phenylene-based material is comprised of phenylene-diamond, a benzimidazone polymer or a polyallylether.

10. The semiconductor device described in claim 6, wherein barrier conductive film includes a tantalum film.

* * * * *